United States Patent
Hansen et al.

(10) Patent No.: US 10,709,041 B2
(45) Date of Patent: Jul. 7, 2020

(54) LIGHTNING STRIKE AND ELECTROMAGNETIC PROTECTION SYSTEM

(71) Applicant: Conductive Composites Company, LLC, Heber City, UT (US)

(72) Inventors: George Clayton Hansen, Midway, UT (US); Nathan D. Hansen, Heber, UT (US); David Widauf, Layton, UT (US)

( * ) Notice: Subject to any disclaimer, the term of this patent is extended or adjusted under 35 U.S.C. 154(b) by 400 days.

(21) Appl. No.: 14/887,182

(22) Filed: Oct. 19, 2015

(65) Prior Publication Data
US 2016/0044834 A1 Feb. 11, 2016

Related U.S. Application Data

(60) Continuation of application No. 13/857,927, filed on Apr. 5, 2013, now Pat. No. 9,167,733, which is a division of application No. 12/698,961, filed on Feb. 2, 2010, now Pat. No. 8,415,568.

(60) Provisional application No. 61/149,116, filed on Feb. 2, 2009.

(51) Int. Cl.
*H05K 9/00* (2006.01)
*H05F 3/02* (2006.01)

(52) U.S. Cl.
CPC ............ *H05K 9/0007* (2013.01); *H05F 3/02* (2013.01); *H05K 9/00* (2013.01); *H05K 9/0009* (2013.01); *H05K 9/0081* (2013.01); *H05K 9/0083* (2013.01); *H05K 9/0084* (2013.01); *H05K 9/0086* (2013.01); *H05K 9/0088* (2013.01)

(58) Field of Classification Search
CPC .. H05K 9/0009; H05K 9/0081; H05K 9/0083; H05K 9/0084; H05K 9/0086; H05K 9/0088; H05K 9/00; H05K 9/0007; B29C 70/882; D04H 5/00; Y10T 428/249931; Y10T 428/249933; H05F 3/02; Y10S 977/754; Y10S 977/778
USPC .......... 428/294.4, 295.1; 977/775, 778, 754; 174/2, 394; 343/897
See application file for complete search history.

(56) References Cited

U.S. PATENT DOCUMENTS 6,344,978 B1 2/2002 Komiya
7,183,484 B1 2/2007 May
(Continued)

*Primary Examiner* — Camie S Thompson
(74) *Attorney, Agent, or Firm* — Madson IP, P.C.

(57) ABSTRACT

A composite article for incorporation at the surface of an assembly, the composite article being capable of withstanding a lightning strike by dissipating the energy of the lightning strike and by shielding the assembly from electromagnetic energy associated with the lightning strike. The composite article has a base structure made of a material exhibiting electrical conductivity that is inadequate to dissipate lightning strike energy and also inadequate to shield the assembly from the associated electromagnetic energy. Against the outer face of the base structure an electrically-conductive lightning shield is secured. The lightning shield has a substantially uniformly-distributed embedment of electrically-conductive nanostrands in a matrix that otherwise exhibits electrical conductivity that is inadequate to dissipate lightning strike energy and inadequate to shield the assembly from associated electromagnetic energy. Alternatively, an electrically-conductive ground plane may be secured against the outer face of the base structure.

15 Claims, 9 Drawing Sheets

(56) References Cited

U.S. PATENT DOCUMENTS 8,361,608 B1 * 1/2013 Hansen ................ B29C 70/882
428/294.4
2008/0078576 A1 4/2008 Blacker et al.

* cited by examiner

LIGHTNING STRIKE AND ELECTROMAGNETIC PROTECTION SYSTEM

CROSS-REFERENCED AND RELATED APPLICATIONS

This application is a continuation of U.S. application Ser. No. 13/857,927, filed Apr. 5, 2013 ("Parent Application"), which is incorporated by this reference. The Parent Application is a divisional of U.S. patent application Ser. No. 12/698,961, filed Feb. 2, 2010 ("Grandparent Application"), which is incorporated by this reference. The Grandparent Application claims the benefit of and is a continuation-in-part application of U.S. Provisional Application Ser. No. 61/149,116 that was filed on Feb. 2, 2009, which is incorporated by this reference.

This application is related by subject matter to each of the following United States patent applications, which are individually and collectively incorporated herein by reference:
  a. U.S. patent application Ser. No. 10/414,266;
  b. U.S. patent application Ser. No. 11/609,113;
  c. U.S. patent application Ser. No. 12/260,999; and
  d. U.S. patent application Ser. No. 12/261,006.

Because the claims are directed to lightning strike applications, for the sake of brevity and so not to obscure, this disclosure will describe the information relating to those applications and the materials and composites that enhance lightning strike protections. Such information was disclosed within the Parent Application and the Grandparent Application by incorporated reference to U.S. patent application Ser. No. 12/260,999. The disclosures of the Parent Application and Grandparent Application will be included where applicable to lightning strike applications and will otherwise be incorporated by reference.

BACKGROUND OF THE INVENTION

The present disclosure relates to the design of electromagnetic shielding and lightning strike protection. More particularly, the present disclosure relates to polymeric, elastomeric, and ceramic materials, and to composites in which such materials are employed as an adhesive, a matrix, or a coating, and to surfaces of static or mobile assemblies in which are incorporated into such materials or composites employing such materials. Such materials and composites relate to the enhancement of the electrical conductivity of such materials, composites, and surfaces, thereby to afford lightning strike protection to assemblies in which such materials or such composites are incorporated.

Polymeric materials, either alone or as composites reinforced with powders or fibers, are attractive engineering compositions, exhibiting characteristics of cost, weight, and workability that individually or in combination prove decisively advantageous on behalf of use in diverse circumstances.

For example, polymeric materials and fiber-reinforced polymer-based composites are acquiring increased importance in the construction of fixed assemblies, such as outdoor shelters, signal antennas, power transmission towers, and wind generators, as well as in the construction of mobile assemblies, such as land vehicles, ships, aircraft, satellites, and rockets. In constructing these types of assemblies, a combination of light weight and remarkable stiffness makes polymeric materials and polymer-based composites having reinforcing fibers superior to metal as compositions from which to fashion components.

Yet, in most cases, polymeric materials and polymer-based composites lack the electromagnetic responsiveness associated with metals. Even when a polymer-based composite includes reinforcing fibers that are electrically-conductive, as is the case with carbon fibers and with metal-coated fibers, the resulting composite is electrical conductive only in a direction that is aligned with the fibers embedded therein.

Poor electrically conductivity in polymeric materials and polymer-based composites is problematic when components fashioned therefrom are incorporated into the surface of fixed or mobile assemblies.

Surface locations wanting in an ability to conduct electricity allow localized electrostatic surface charges to build up over time. These charges are then capable of dissipation only through the potentially incendiary and surface-damaging mechanism of sparking and arcing.

On an electrically-nonconductive surface of an assembly, the electricity from a lightning strike is not conducted safely from the site of the strike along or through the surface to intended grounding structures. Consequently, notorious forms of disintegration befall the assembly at the site of the strike. There, blistering, melting, delamination, incineration, and even penetration are common.

Accompanying a lightning strike are intense spikes of electromagnetic energy that induce correspondingly large pulses of electrical current in electrical circuitry in the vicinity of the lightning, both disrupting and disabling nearby electrical circuit elements. Onboard navigation and control systems on aircraft, rockets, and satellites are particular vulnerable to such electromagnetic damage, whether or not originating from lightning, and devastating secondary consequences following when such systems fail. Misfortunes of such origin can be mitigated or avoided entirely by surrounding vulnerable circuitry with an appropriately-configured shield that either absorbs or reflects incoming electromagnetic energy.

Any such electromagnetically-impenetrable shield must, however, be highly and solidly electrically-conductive, as would be the case with an unbroken metal skin on the surface of an assembly in which vulnerable circuitry is deployed. Accordingly, the replacement of metal in surfaces of fixed and mobile assemblies by polymeric, elastomeric, and ceramic materials and by fiber composites in which such materials are employed eliminates advantageous electromagnetic shielding for circuits within those assemblies.

Numerous attempts have been made to overcome or ameliorate the want of electrical conductivity in surfaces of assemblies that incorporate polymeric, elastomeric, and ceramic materials and fiber composites in which such materials are employed.

One general approach to restoring electrical conductivity, involves adding to the outer surface of an electrically-nonconductive base structure a ground plane of electrically-conductive broad goods, such as wires, screens, meshes, weavings, or expanded foils made of metals, such as copper, brass, or aluminum. In the alternative, the broad goods in such a ground plane can include electrically-nonconductive fibers that have been rendered electrically-conductive by being electroplated or otherwise coated with an electrically-conductive material, such as a metal. Electrically-nonconductive fibers coated with metal are also woven into fabrics or bound into papers before being employed in ground planes as electrically-conductive broad goods. Wire weave fabrics made of metal fibers interwoven with electrically-nonconductive fabrics also serve as electrically-conductive broad goods in ground planes.

Another general approach to restoring electrical conductivity involves making the outer layer of the electrically-nonconductive base structure into a layer that itself exhibits electrically-conductivity. This can be accomplished, for example, by incorporating wound or woven wire or nickel-coated carbon fibers into the outer plies of the base structure. Alternatively, electrically-conductive additives are introduced into the polymeric material from which those outer plies are eventually fashioned. Acceptable additives for this purpose include powders of metals, such as silver, copper, nickel, or iron, and fibers made of or coated with such metals.

Yet a final general approach to restoring electrical conductivity involves applying to the outer surface of the electrically-nonconductive base structure electrically-conductive foils or a coating of a paint containing flakes, particles, or powders of metals, such as silver or copper.

Each approach described above has demonstrated advantages and demonstrated shortcomings, but no single approach or combination of approaches has enabled an electrically-nonconductive composite article incorporated into the surface of a fixed or mobile assembly to fully withstand a lightning strike both, by efficiently dissipating the energy of the lightning strike, and by shielding the interior of the assembly for electromagnetic pulses associated with the lightning strike.

BRIEF SUMMARY OF THE INVENTION

The composite of the present disclosure may be incorporated at the surface of an assembly, such as the fuselage for a plane or any surface that is susceptible to lightning strikes. The composite is capable of withstanding a lightning strike by dissipating the energy of the lightning strike and by shielding the assembly from the electromagnetic energy associated with the lightning strike. The composite has a base structure made of a material that exhibits electrical conductivity inadequate to dissipate the lightning strike energy and also inadequate to shield the assembly from the associated electromagnetic energy. This base structure has an outer face against which an electrically-conductive lightning shield is secured. The shield comprises a substantially uniformly-distributed embedment of electrically-conductive nanostrands in a matrix that otherwise exhibits electrical conductivity inadequate to dissipate the lightning strike energy and also inadequate to shield the assembly from the associated electromagnetic energy of a lightning strike.

The lightning shield may have an electrically-conductive ground plane engaging the outer face of the base structure. The ground plane may comprise a planar mesh of electrically-conductive broad goods and a filling comprised of the embedment of nanostrands that occupies interstices between the mesh of the broad goods.

The lightning shield alternatively may comprise a three-dimensional veil of the electrically-conductive nanostrands that engage the outer face of the base structure. The veil may also be embedded in the matrix. Further, the lightning shield may comprise an electrically-conductive ground plane that is secured to the outer face of the base structure and an electrically-conductive skin comprised of the embedment of nanostrands disposed on the ground plane.

The nanostrands may be comprised of a metal such as nickel, nickel aluminides, iron, iron aluminides, alloys of nickel and iron, and alloys of nickel and copper.

The matrix may comprise a primer material and/or a paint material that engages or is attached to the outer face of the base structure.

Another embodiment of a composite capable of withstanding a lightning strike by dissipating the energy of the lightning strike and by shielding the assembly from electromagnetic energy associated with the lightning strike has a base structure comprised of a material that exhibits electrical conductivity that is inadequate to dissipate lightning strike energy and is also inadequate to shield the assembly from the associated electromagnetic energy. The base structure has an outer face at the assembly surface and an electrically-conductive lightning shield that is secured against the outer face of the base structure. The shield comprises a metal chemical-vapor-deposition coated non-woven material embedded in a matrix that otherwise exhibits electrical conductivity that is inadequate to dissipate the lightning strike energy and also inadequate to shield the assembly from the associated electromagnetic energy.

A further embodiment of a composite capable of withstanding a lightning strike by dissipating the energy of the lightning strike and by shielding the assembly from electromagnetic energy associated with the lightning strike has a base structure comprised of a material that exhibits electrical conductivity that is inadequate to dissipate lightning strike energy and is also inadequate to shield the assembly from the associated electromagnetic energy. The base structure has an outer face and an electrically-conductive lightning shield that is secured against the outer face of the base structure. The shield comprises a substantially uniform distribution of electrically-conductive nanostrands co-cured into the base structure.

Yet another embodiment of an assembly capable of withstanding a lightning strike by dissipating the energy of the lightning strike and by shielding the assembly from electromagnetic energy associated with the lightning strike has a base structure comprised of a material that exhibits electrical conductivity that is inadequate to dissipate lightning strike energy and is also inadequate to shield the assembly from the associated electromagnetic energy. The assembly also has a first electrically-conductive lightning shield secured against the outer face of the base structure and a second electrically-conductive lightning shield secured against the outer face of the base structure in a non-overlapping relationship to the first lightning shield such that an edge of the second lightning shield opposes an edge of the first lightning shield. An electrically-conductive interface interconnects the edge of the first lightning shield and the opposing edge of the second lightning shield. This interface comprises a substantially uniformly-distributed embedment of electrically-conductive nanostrands in an electrically-nonconductive matrix. The interface may further comprise metal-coated, chopped macroscale fibers.

BRIEF DESCRIPTION OF THE SEVERAL VIEWS OF THE DRAWINGS

In order that the manner in which the above-recited and other features and advantages of this disclosure are obtained will be readily understood, a more particular description of the technology of this disclosure briefly described above will be rendered by reference to specific embodiments thereof which are illustrated in the appended drawings. Understanding that these drawings depict only typical embodiments and are not therefore to be considered to be limiting of its scope, the exemplary embodiments will be described and explained with additional specificity and detail through the use of the accompanying drawings in which.

DETAILED DESCRIPTION OF THE INVENTION

Figure 1:
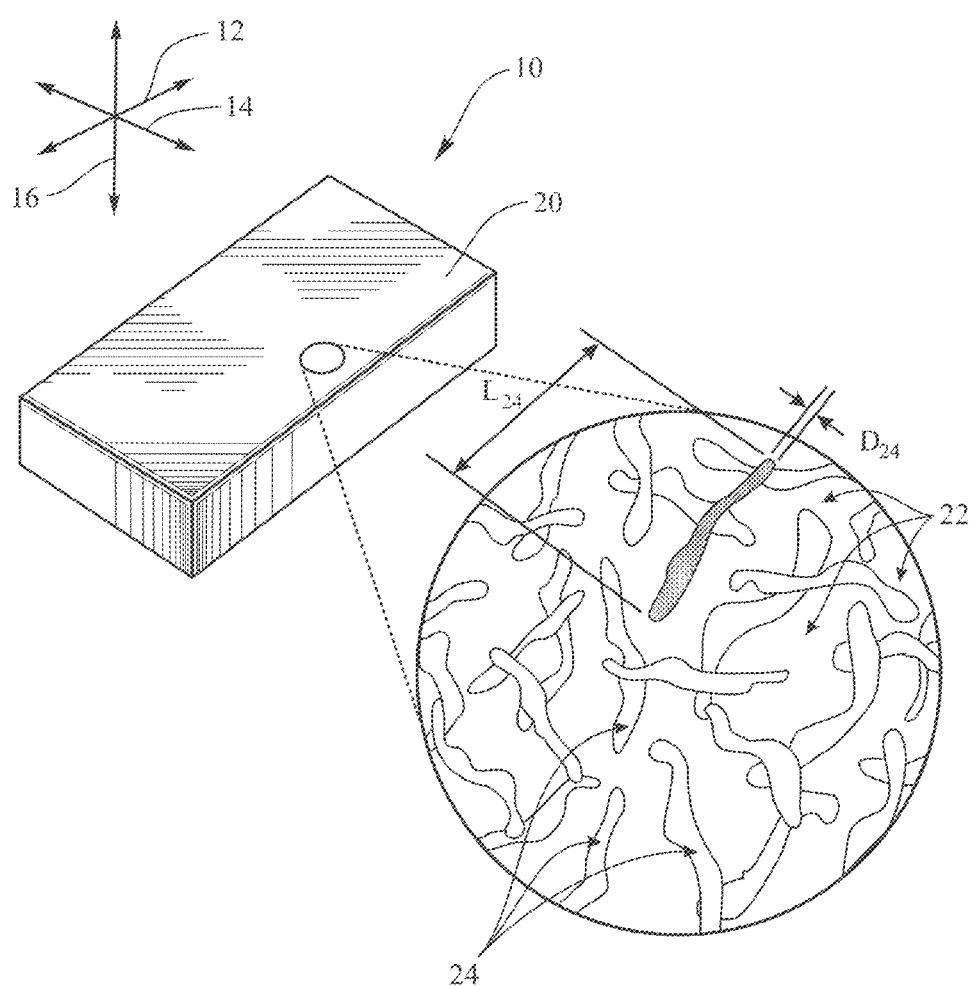
FIG. 1 is a perspective view with an accompanying inset of an article formed from a first embodiment of a composite material incorporating teachings of the present disclosure, the insert illustrating in microscopic perspective nanostrands distributed in the matrix of the composite material.

The exemplary embodiments of the present disclosure will be best understood by reference to the drawings, wherein like parts are designated by like numerals throughout. It will be readily understood that the components of the present disclosure, as generally described and illustrated in the figures herein, could be arranged and designed in a wide variety of different configurations. Thus, the following more detailed description of exemplary embodiments of the apparatus, system, and method of the present disclosure, as represented in FIGS. 1-12, is not intended to limit the scope of the disclosure, as claimed, but is merely representative of exemplary embodiments.

As used herein, the expressions "connected to," "coupled to," and "in communication with" are intended to refer to any form of interaction between two or more entities, including mechanical, electrical, magnetic, electromagnetic, and thermal interactions. Also, as used herein, the expression "attached to" is intended to refer to a form of mechanical interaction that restricts relative translation or rotation between two or more objects, whether or not those objects directly engage each other.

Electrostatic discharge, lightning strikes, and the associated damage and secondary electromagnetic effects continue to be a major problem for fixed and mobile assemblies having composite articles incorporated into the exterior surfaces thereof that exhibit poor electrical conductivity.

It has been concluded that a significant reason for the observed inadequacies in existing lightning protection systems for such composite articles is that, even though the broad goods or macroscale fibers employed in such lightning protection systems are electrically-conductive, those broad goods and macroscale fibers are at the macroscale level ultimately interconnected by or encapsulated in electrically-nonconductive polymeric, ceramic, and adhesive materials. Further, the face on the side of such a lightning protection system opposite from the composite article is routinely coated with electrically-nonconductive layers of primer and paint.

When lightning attempts to attach to the surface of a composite article equipped with such a lightning protection system, a great deal of electromagnetic energy in the lightning is expended in finding and creating a conductive path from the primed and painted exterior surface to the electrically-conductive broad goods and macroscale fibers buried in electrically-nonconductive materials therebelow. This expended energy is converted by resistive heating into thermal energy, resulting in expansion, vaporization, explosion, and all manner of associated lightning strike damage, both to the lightning protection system and to the associated, ostensibly protected composite structure.

Such a concentrated discharge of lightning energy correspondingly gives rise to significant electromagnetic interference throughout the interior of the structure suffering the lightning strike, but the material composition and open geometry of most types of ground planes used in lightning protection systems offer only a limited amount of electromagnetic wave protection, either as a protection from broadband electromagnetic shock, or as general electromagnetic protection form all other incoming broadband electromagnetic energy. This is particularly true at higher frequencies employed by many newer onboard operating systems. The secondary electromagnetic pulse from a lightning strike often permeates and incapacitates the avionics and electronics systems of a aircraft hit by lightning, rendering the aircraft incapable of controlled flight.

Even where composite articles incorporated at the surface of an assembly are relatively electrically conductive, individual components among those composite articles are, unfortunately, routinely assembled, joined, or sealed to each other using electrically-nonconductive adhesives and sealants. As a result, the ability for lightning strike energy or electrostatic differentials to travel nondestructively over the surface of the assembly is impeded. Then expensive remedial secondary measures, such as the use of ground straps, must be employed to ensure that electrical continuity exists between adjacent composite articles and throughout the complete surface of the assembly.

Finally, contrasts in galvanic potential between components of a lightning strike protection system can accelerate the corrosion of many available electrically-conductive materials. Copper, aluminum, and silver are all easily corroded, either by galvanic reactions with carbon, or by exposure to salt environments.

The teachings of the present disclosure provide an improved lightning strike and electromagnetic protection system for otherwise electrically-nonconductive or poorly electrically-conducting composite structures and skins. Those teachings include the creation, not only of a conventional electrically-conductive ground plane or an electrically-conductive skin at the outer face of the composite, but also the use of electrically-conductive coatings or paints on the outermost surface of the entire structure. This dual, electrically-conductive layer approach provides full lightning strike protection.

The present disclosure prescribes, for example, that polymers associated with primer and paint be made electrically-conductive by the addition of highly electrically-conductive nickel chemical-vapor-deposition (hereinafter "CDV") coated papers of non-woven or thinly-woven scrim. Also taught by the present disclosure as lending electrically conductivity to composites is the addition to such polymers and to resins that secure fibers and metallic meshes of metal nanostrands.

As used herein, the expression "nanostrands" is intended to refer to highly-branched, three-dimensional, open chains of filamentary metal. Being made exclusively of metal, nanostrands conduct electricity readily and are highly electromagnetically responsive. The branches of nanostrands grow to great lengths as compared with the average diameters of those branches. Consequently, nanostrands exhibit large aspect ratios. Often these branches form enlarged loops. Nanostrands occupy large volumes of space very efficiently using small quantities of metal. The metal in the branches of a nanostrand enable almost effortless and instantaneous electrical and electromagnetic communications throughout a comparatively vast volume of space. When being electromagnetically active, nanostrands operate as minute Faraday cages.

The metal from which a nanostrand is constructed is chosen from among a group of metals that includes nickel, nickel aluminides, iron, iron aluminides, alloys of nickel and iron, and alloys of nickel and copper. Nanostrands are to be contrasted with macroscale carbon reinforcing fibers and with fine metal powders of lower aspect ratio, which exhibit insufficient electrical-conductivity for the purposes toward which the present disclosure is directed.

When the above teachings are embodied in a structure, that structure can withstand direct Zone 1, Zone 2, and Zone 3 lightning strikes with no appreciable damage. The lightning of the strike dances about the outermost paint surface on the structure, while underlying ground planes and structure remain unaffected.

When a conventional lightning strike protection system painted with a dielectric, or electrically-nonconductive, polymer is hit by lightning, the lightning initially burns a path through the paint to the electrically-conductive components of the lightning strike protection system. Once this path for the electricity of the lightning is created, ail of the energy of the lightning strike then passes in a concentrated manner along that path. This causes physical damage both to the surface and to the underlying composite article. Explosive vaporization occurs within the composites of the lightning strike protection layer.

If the painted surface is instead electrically-conductive, a very different set of consequences occur. Then the lightning will still burn a bit of the paint at a first location and there enter the lightning protection system there below, but the lightning will also naturally and immediately seek to enlarge the conductive path along which it can do so by dancing over the conductive surface distributing its energy and consequent minor paint damage to other locations.

During the lightning strike, the underlying ground plane remains intact, continuing to provide electromagnetic shielding protection. As nanostrands are more finely divided than the more open expanded foils and weaves of wire, conductive nanomaterials provide lightning strike protection to high frequencies. Copper mesh, for example, starts to lose electromagnetic effectiveness at about 1 GHz and is essentially ineffective above about 5 GHz. By contrast, nanostrands and nickel CDV-coated fibers, fabrics, and papers remain fully effective as electromagnetic shielding well above 20 GHz.

A lightning protection system embodying teachings of the present disclosure is, accordingly, capable of simultaneously providing protection from lightning strikes, from electrostatic discharges, and broadband electromagnetic energy. The present disclosure thus introduce a plurality of distinct lightning protection system constituent materials, such as highly electrically-conductive resins, adhesives, paints, sealants, and coatings, as well as in highly electrically-conductive macroscale composites.

The implementation of the present disclosure results in previously unavailable levels of lightning strike protection that limit to functionally insignificant or undetectable levels of lightning strike damage to composite structures. Among the inventive teachings is the manufacture and use of highly electrically-conductive, metal CDV-coated papers that are up to three orders of magnitude more conductive than papers fabricated from metal-coated fibers. Metal CDV-coated papers successfully interact with lightning. Also among the teachings of the present disclosure are the manufacture and use of highly electrically-conductive nanomaterials, such as metal-coated carbon nanofibers and metal nanostrands. The present disclosure also teaches the synergistic use in a composite of a ground plane overlain by an electrically-conductive skin of primer and/or paint.

If every component of a lightning strike protection system is rendered sufficiently electrically-conductive, then a sufficient number of diverse paths exist in the structure of that system to conduct electricity about the structure and shield the structure from secondary electromagnetic effects. It has been observed in practice, however, that a thin top coating of normal paint may be used, if the underlying primer and ground plane are sufficiently conductive. It is also important to avoid establishing capacitance effects between the different layers of the system or in the resin-rich laminar regions of the composite.

In one exemplary embodiment of a lightning protection system incorporating teachings of the present disclosure, all of the components of the structure needing protection and the coatings and connections associated therewith are matched in electrically-conductivity. This does not mean that all of the components should be as fully electrically-conductive as possible. Instead, each part of such a system need be only as conductive as achieves such a match. Matching the electrical-conductivity of components affords for a correct level of conductivity in each. This conserves weight and cost. A lightning protection system according to teachings of the present system can accommodate a conventional ground plane that employs expanded foils, metal meshes or screens, woven or wound wires, or nickel coated carbon fibers in the forms of a tow, a cloth, or a paper.

The paper found most effective in such a role is paper that has been nickel coated after the fibers of paper have become bonded to each other. A suitable nickel coating can be effected by a dry method, such as by CVD. Thus, a paper is created that is one to three orders of magnitude more conductive than paper made by adhering together previously coated and then chopped nickel-coated carbon fibers. The metal CVD-coated paper is enhanced in electrical conductivity, because the nickel coating is continuous on the outside of the fibers and the binder. In the conventional papers; the chopped fibers, while coated with a metal, are still electrically insulated from each other by the very binder that serves to hold the fibers together. In many applications, conventional paper or metal CVD-coated paper may prove satisfactory, but optimum results will result from the use of later.

Nickel coated carbon fiber ground planes work best with respect to multifunctionality and weight savings. The conductive metal paths incorporated thereby into a ground plane are a multiplicity of small diameter traces taking the form of sub-micron coatings on each individual fiber. The fibers still retain their mechanical integrity, and continue to serve as structural fibers. Thus, the only added weight is the thin metal coating. This system not only allows for a greater number of closely located conductors, but also does not require any additional resin to hold the conductors to the surface of the fibers, as is required with the other secondary methods. These metal-coated fibers become multifunctional, serving as both structure and conductor. The fibers may be in the form of a tow, cloth or paper. Only the outer ply or plies of the structure need to be nickel coated. The nickel coating may range from about 10% by weight up to about 70% by weight. Coating in the range of about 20% by weight to about 45% by weight is best.

In applications where lower electromagnetic protection is required, such as lower energy strike zones or those needing electromagnetic or electrostatic protection only, a less robust ground plane is needed. In such cases, for instance, the carbon fiber alone may act as a sufficient plane. Even nanostrands alone may act as a ground plane.

A second component of a lightning protection system according to teachings of the present disclosure is to ensure that the resin within, around, and upon the ground plane is sufficiently electrically-conductive. This is accomplished in one of two methods. The first is to create a continuous three-dimensionally interconnected veil of nanostrands. Alternatively, nanostrands are added to the resin that is impregnated into a ground plane.

A combination of these methods may be particularly effective. For instance, metal foils, wires, or meshes, conductive nanostrands will act both, as conductive electromagnetic filler for the dielectric, open areas of the mesh or expanded foil, and as a physical and electrical surfacing agent. But in the case of carbon fiber materials, the nanomaterials added to the resin will act to fill in both the surface and the interlaminar regions of the composite. By either method, the spaces in, around and above the ground plane are made conductive.

In filling all of these previously non-conducting volumes, nickel nanostrands extend the effective range of broadband electromagnetic protection and shielding efficiency. Nanostrands of nickel, nickel aluminides, iron, iron aluminides, alloys of nickel and iron, and alloys of nickel and copper are advantageously resistant to, galvanic corrosion in the presence of carbon and to corrosive environments.

Ground planes routinely need to be treated with a surface smoothing agent or filler. Smoothing agents and fillers, according to teachings of the present disclosure, made conductive by the addition of sufficient nanostrands, but surprisingly, the capillary action of nanostrands in regular agents and fillers creates physically smooth surfaces thereupon.

A third component of a lightning protection system according to teachings of the present disclosure creates a conductive outer surface, coating, or paint. This may be done by adding nanostrands to the paint, either the primer or the top coating; or both. This may also be done by creating a thin paper of woven or nonwoven metal-coated fibers, or a sheet made of the conductive nanostrands. This thin structure may then be embedded into the primer or the paint. In any case, it is important that the layer immediately on top of the previously described ground plane and associated resins and surfacers be as conductive as possible. The optimal application is for the outermost paint to also be conductive, but this is not essential.

The final component of a lightning protection system according to teachings of the present disclosure ensures that the electrically-conductive structures are well connected electrically to each other. This is accomplished by adding sufficient electrically conductive sealants or adhesives using nanomaterials to the resin or adhesive. A combination of nanostrands and chopped nickel-coated fibers act synergistically to provide even better electrical conductivity. Alternatively, a conductive interface is made by impregnating a thin sheet of nanostrands or of nickel-coated nanofiber veil with the adhesive or sealant, and placing this sheet at any interface between electrically-conductive structures. This method creates a large number of electrically-conductive paths between the interfaces that are thusly joined. This method is also an excellent way to create a highly electrically-conductive gasket.

There are many conductive adhesives and fillers that already serve this function. But they are usually very heavily loaded. The branched nature of nanostrands allows significantly lower loading and weight to achieve the same levels of conductivity as other more highly loaded conventional materials. This in turn, allows for lowered weight and the preservation of the mechanical properties of the adhesive or filler.

FIG. 1 is a perspective view of an article 10 formed from a first embodiment of a composite material 20 incorporating teachings of the present disclosure. While article 10 assumes an arbitrary, rectangular shape in FIG. 1, article 10 can be formed into other shapes without departing from those teachings. Article 10 has a longitudinal direction 12, a lateral direction 14, and a transverse direction 16. Composite material 20 provides a relatively high degree of electrical conductivity, thereby to enable electrical current to flow through article 10 with comparatively low resistance.

As shown in the inset included in FIG. 1, composite material 20 includes an electrically-nonconductive matrix 22 in which a plurality of graphically streamlined nanostrands 24 are distributed in a generally random orientation. Streamlined nanostrands 24 are not shown to branch in a manner that is typical in many types of nanostrands.

Matrix 22 may be a nonmetallic material such as a polymer, a ceramic, or an elastomer. Matrix 22 may, however, include various additives or be a combination of multiple materials. Polymers that have been found to possess enhanced electrical conductivity when combined with metallic nanostrands include epoxy, acrylic, water-based paints, urethanes, lacquers, silicone elastomers, and thermoplastics such as polyethylene, although matrix 22 is not limited to including these materials.

Graphically streamlined nanostrands 24 are made of a metal chosen from among the group of metals including nickel, nickel aluminides, iron, iron aluminides, alloys of nickel and iron, and alloys of nickel and copper. As shown, a typical graphically streamlined nanostrand 24, which is stippled in FIG. 1, has an average diameter $D_{24}$ and an average length $L_{24}$, that are each indicated by dimension lines tied to the inset of FIG. 1.

As used herein, the term "metallic" when applied to a nanostrand is intended to include a variety of structures made wholly or mostly of one or more metals. The term "metal" in this context is intended to exclude carbon; while carbon may be considered a metal in some fields, carbon with metals added thereto lacks sufficient electrical conductivity to encourage its use as an electrical conductor in the context of the present disclosure.

Graphically streamlined nanostrands 24 typically exhibit an average diameter $D_{24}$ as small as 25 nanometers and as large as several microns, depending on the conditions of manufacture and the desired application. For some applications, average diameter $D_{24}$ ranges from about 0.5 microns to about 2 microns. In other embodiments, average diameter $D_{24}$ is about 1 micron. Proper selection of average diameter $D_{24}$ enhances the electrical conductivity lent to composite material 20 by the presence of streamlined nanostrands 24 in matrix 22. Average length $L_{24}$ of graphically streamlined nanostrands 24 ranges from about 0.1 micron to about 4 microns.

Graphically streamlined nanostrands 24 have an average aspect ratio, or length-to-diameter ratio, which is defined as the average length $L_{24}$ divided by the average diameter $D_{24}$. Graphically streamlined nanostrands 24 typically exhibit aspect ratios of at least 20-to-1, but often between about 50-to-1, and even about 500-to-1. In some cases, aspect ratios of thousands-to-1 have been observed. The use of graphically streamlined nanostrands 24 having greater aspect ratios may enhance the electrical conductivity of composite material 20, but longer aspect ratios also introduce practical limitations with respect to incorporating graphically streamlined nanostrands 24 into an article, such as article 10. Graphically streamlined nanostrands 24 having an aspect ratio over about 1000-to-1 may be difficult to disperse in a matrix, such as matrix 22. Thus, the average aspect ratio for graphically streamlined nanostrands 24 may advantageously range from about 10-to-1 to about 1000-to-1.

The aspect ratios of graphically streamlined nanostrands 24 are further limited by the type of process used to form article 10. Some manufacturing processes tend to sever nanostrands, thereby reducing the effective aspect ratio of nanostrands in a matrix produced by such processes. Article 10 may in the alternative or in addition include chopped fiber nanostrands, i.e., nanostrands with a deliberately limited average length $L_{24}$, and therefore a limited aspect ratio.

Electrical conductivity is afforded to composite material 20 through the use of comparatively low volumetric concentrations of graphically streamlined nanostrands 24. The volumetric concentration of graphically streamlined nanostrands 24 is the volume of graphically streamlined nanostrands 24 divided by the volume of composite material 20 in which that volume of streamlined nanostrands 24 is dispersed and embedded. For a matrix, such as matrix 22, the volumetric concentration of graphically streamlined nanostrands 24 may range from about 0.5% to about 30%, more narrowly from about 2% to about 20%, and most narrowly from about 5% to about 15%. Some factors that affect the volumetric concentration required include average diameter $D_{24}$, average aspect ratio, the degree of branching present in the nanostrands employed, and the surface chemistry, surface tension, and viscosity of those nanostrands and of matrix 22.

A large aspect ratio enhances the electrical conductivity of composite material 20. A relatively high degree of branching in the nanostrands employed promotes electrical conductivity using a low volumetric concentration of those nanostrands. Branching enhances the electrical and electromagnetic interconnections arising between and among individual nanostrands, thereby enhancing the number of pathways for electrical current and the number of electromagnetic links throughout composite material 20. Graphic representations of such branched nanostrands are illustrated in FIG. 2.

In certain applications, it is desirable to lend electrical conductivity to an article that is formed of an electrical-nonconductive material without altering the interior structure of the material. Such a procedure is useful in modifying existing equipment to provide conductive surfacing, as in the case of electromagnetic shielding. Furthermore, such a procedure is useful for articles that cannot reasonably be constructed of a solid composite material. One embodiment of a composite material that can be applied to a surface will be shown and described also in connection with FIG. 2.

Figure 2:
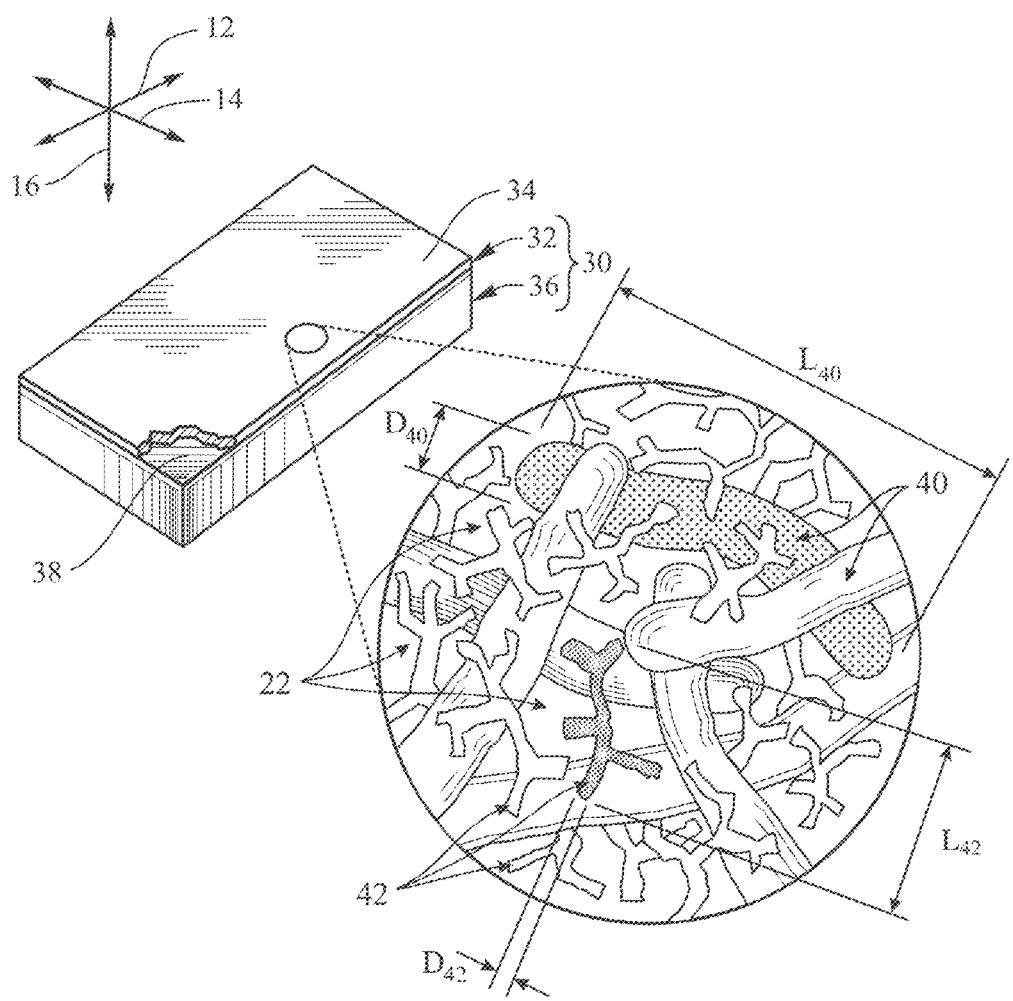
FIG. 2 is a perspective view with an accompanying inset of a composite article made of the combination of a base structure that exhibits poor electrical conductivity with a layer formed from a second embodiment of a composite material incorporating teachings of the present disclosure, the insert illustrating in microscopic perspective fibers and nanostrands distributed in the matrix of the composite material.

FIG. 2 is a perspective view of an article 30 for incorporation into the surface of a fixed or mobile assembly. Article 30 includes a surface layer 32 formed from a second embodiment of a composite material 34 incorporating teachings of the present disclosure. As shown, article 30 also includes a base structure 36 that is made from a material exhibiting electrical conductivity inadequate to dissipate lightning strike energy and shield from the associated electromagnetic energy the interior of article 30 and any assembly into which article 30 is incorporated. Base structure 36 has an outer face 38 that would be exposed at the surface of the assembly, when article 30 is incorporated thereinto. For the purpose of providing lightning protection to base structure 36 and to article 30, the electrical conductivity of outer face 38 has been enhanced by the application thereto of composite material 34.

As shown in the inset included in FIG. 2, composite material 34 includes an electrically-nonconductive matrix 22 in which a plurality of branched nanostrands 42 and a plurality of macroscale fibers 40 are dispersed and embedded. Fibers 40 have an average diameter $D_{40}$ and an average length $L_{40}$. Branched nanostrands 42 have an average diameter $D_{42}$ and an average length $L_{42}$. Average diameter $D_{40}$ of fibers 40 is much larger than average diameter of branched nanostrands 42, and average length $L_{40}$ of fibers 40 is larger than average length $L_{42}$ shown for branched nanostrands 42.

In the insert included in FIG. 2, branched nanostrands 42 can be seen to be distributed about and between fibers 40 in such a manner that branched nanostrands 42 bridge electrical and electromagnetic gaps between fibers 40. This facilitates the passage of electrical current and electromagnetic signals through composite material 34. If these gaps are short, average diameter $D_{42}$ of branched nanostrands 42 can advantageously be relatively small, because surface tension and viscosity effects on branched nanostrands 42 from matrix 22 are less significant when branched nanostrands 42 bridge short distances. Accordingly, average diameter $D_{42}$ may be small, for example, on the order of about 50 nanometers.

Fibers 40 are constructed of a plurality of electrically conductive materials such as nickel, iron, cobalt, chromium, molybdenum, and other metals. Alternatively, the fibers 40 may be made of a metal coated carbon fiber or the like. Structures performing functions like those served by fibers 40 may also assume the form of platelets. Fibers 40 and branched nanostrands 42 cooperate to synergistically improve the electrical conductivity and electromagnetic responsiveness of composite material 36. The combination of fibers 40 and branched nanostrands 42 in matrix 22 lend a higher degree of electrical conductivity to composite material 36 the same volumetric concentration of either fibers 40 or branched nanostrands 42 alone. In addition, fibers 40 may enhance additional properties of composite material 36, such as mechanical strength, rigidity, or thermal conductivity.

For example, it has been observed that adding a 10% volumetric concentration of a chopped metal-coated-carbon fiber to a polymer matrix provides a volume resistivity of about 100 ohm-cm. Using a 4% volumetric concentration of a particular nanostrand provides a similar volume resistivity. On the other hand, a 5% volumetric concentration of chopped fibers and a 2% volumetric concentration of nanostrands results in a volume resistivity of about 10 ohm-cm, a tenfold, improvement. Using a 10% volumetric concentration of chopped fiber with a 4% volumetric concentration of nanostrands yields a volume resistivity of one ohm-cm, a one-hundred fold improvement. Thus, the branched nanostrands 42 and the fibers 40 interact synergistically to enhance the electrical conductivity of the composite material 36. Due to such synergistic effects, the volumetric concentration of nanostrands included in the composite 36 may be much lower than that of composite 20. For example, a 2% volumetric concentration of the branched nanostrands 42 may be quite sufficient to provide an enormous boost to the electrical conductivity of composite material 36.

Fibers 40 may be selected simply for the purpose of optimizing electrical conductivity. Alternatively, the fibers 40 may be selected to enhance such other properties in composite material 36. Fibers 40 cooperate with the branched nanostrands 42 to provide enhanced electrical conductivity while being specifically selected to provide such other properties. Thus, the selection of additives for the enhancement of electrical conductivity may be at least partially decoupled from selection of additives for the enhancement of such other properties. This enables the independent selection of respective volumetric concentrations of branched nanostrands 42 and of fibers 40 to obtain any desired overall combination of properties in composite material 36.

Nanostrands 40 and fibers 40 are added to matrix 22 in a manner similar to that described in connection with FIG. 1. If fibers 40 are chopped fibers, fibers 40 may be mixed into matrix 22 contemporaneously with branched nanostrands 42. If the fibers 40 are continuous instead, it is likely best to impregnate fibers 40 with the matrix 22 after mixing branched nanostrands 42 into matrix 22.

Generally, with a composite 36 containing continuous fibers 40, the addition of branched nanostrands 42 serves to create electrical conductivity throughout what would otherwise be an electrically-nonconductive matrix. Thus, the branched nanostrands 42 act as dispersed electrical collectors that direct electrical current to the larger and longer fibers. While such fibers also serve to a degree as electrical collectors, the larger and longer fibers serve as very lengthy linear conductive pathways along which to dissipate current rapidly to other areas or out of a composite 36.

Figure 3:
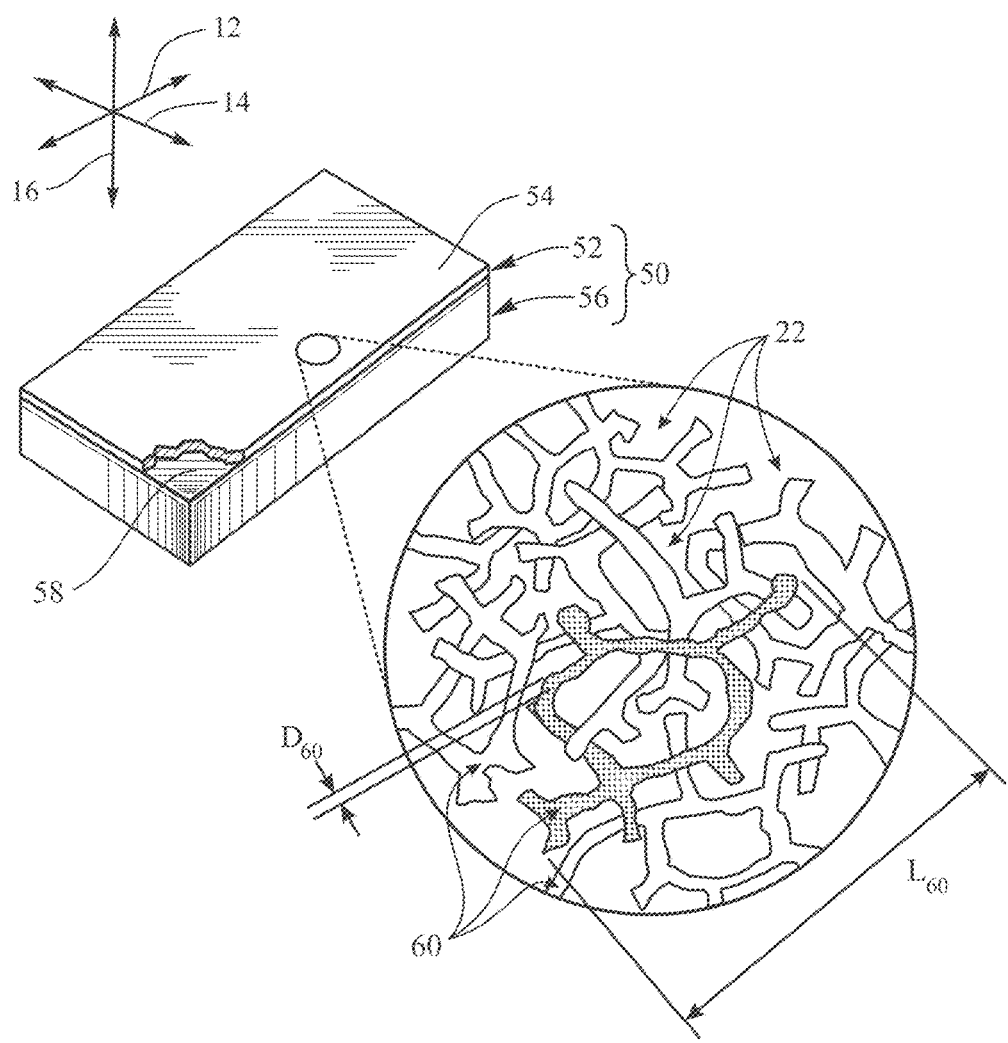
FIG. 3 is a perspective view with an accompanying inset of a first composite article made of the combination of a base structure that exhibits poor electrical conductivity with an electrically-conductive lightning shield that includes among the components thereof a third embodiment of a composite material incorporating teachings of the present disclosure, the insert illustrating in microscopic perspective nanostrands distributed in the matrix of the composite material.

FIG. 3 is a perspective view of an article 50 for incorporation into the surface of an assembly. Article 50 includes a surface layer 52 formed from a third embodiment of a composite material 54 incorporating teachings of the present disclosure. As shown, article 50 also includes a base structure 56 that is made from a material exhibiting electrical conductivity inadequate to dissipate lightning strike energy and shield from the associated electromagnetic energy the interior of article 50 and any assembly into which article 50 is incorporated. Base structure 56 has an outer face 58 that would be exposed at the surface of the assembly, when article 50 is incorporated thereinto. For the purpose of providing lightning protection to base structure 56 and to article 50, the electrical conductivity of outer face 58 has been enhanced by the application thereto of composite material 54.

As shown in the inset included in FIG. 3, composite material 54 includes an electrically-nonconductive matrix 22 in which a plurality of typical nanostrands 60 are dispersed and embedded. The branches of typical nanostrands 60 are extensive to a degree that many form loops of metal in the lattice structure of typical nanostrands 60. This is routine in nanostrands made of metals. Typical nanostrands 60 are shown in FIG. 3 to have an average diameter $D_{60}$ and an average length $L_{60}$.

Figure 4:
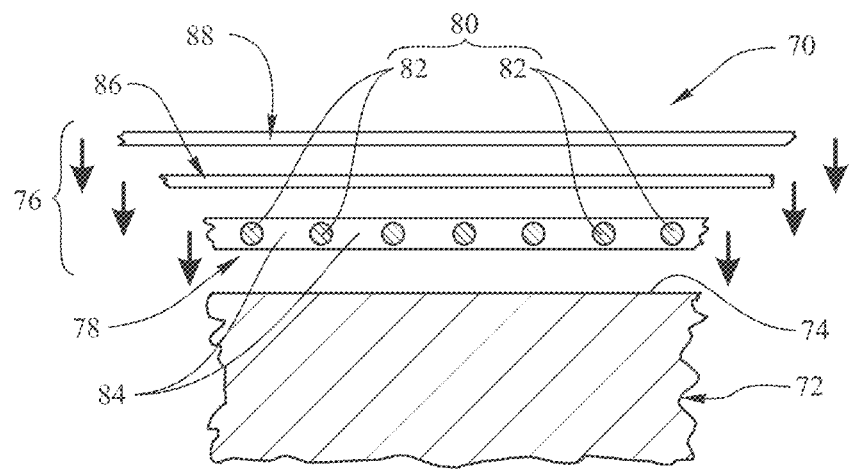
FIG. 4 is a diagram in cross section of partially-disassembled elements of a second composite article embodying teachings of the present disclosure and suitable, therefore, for incorporation into the surface of an assembly that is to withstand a lightning strike.
Figure 5:
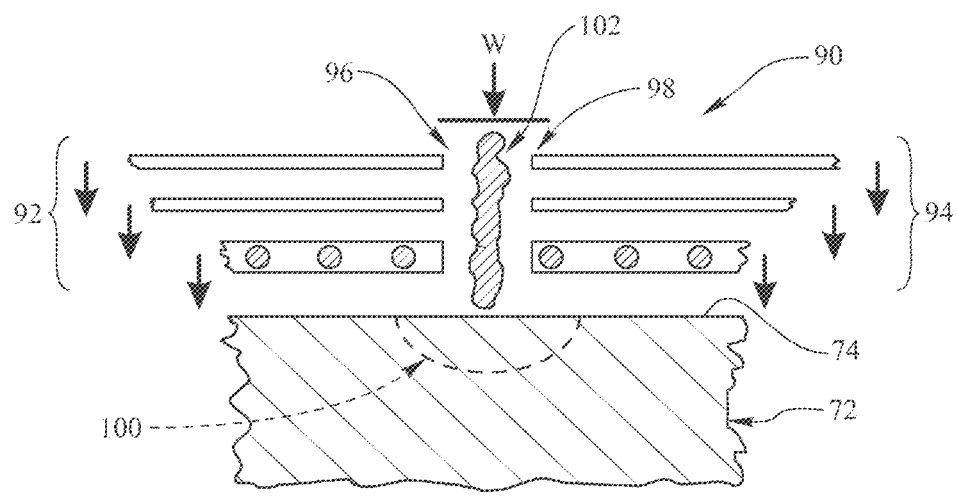
FIG. 5 is a diagram in cross section of partially-disassembled elements of a third composite article embodying teachings of the present disclosure and suitable, therefore, for incorporation into the surface of an assembly that is to withstand a lightning strike.

FIGS. 4 and 5 illustrate schematically in disassembled condition elements of typical lightning protection in systems incorporating teachings of the present disclosure.

Shown in FIG. 4, is an exemplary embodiment of such a lightning protection system 70 used in connection with a base structure 72 comprised of a material exhibiting electrical conductivity inadequate to dissipate lightning strike energy and inadequate to shield an assembly in which base structure 72 is incorporated from associated electromagnetic energy. Base structure 72 has an outer race 74 that would be at the surface of an assembly in which base structure 72 is incorporated.

Lightning protection system 70 takes the form in FIG. 4 of an electrically-conductive lightning shield 76 secured against outer face 74 of base structure 72. In general terms, lightning shield 76 includes somewhere in the layers thereof a substantially uniformly-distributed embedment of electrically-conductive nanostrands in a matrix otherwise exhibiting electrical conductivity inadequate to dissipate lightning strike energy and inadequate to shield the assembly from associated electromagnetic energy. Those nanostrands render the matrix electrically-conductive. The resulting nanocomposite material is made according to the principals and using the materials described above in detail.

By way of example, lightning shield 76 includes an electrically-conductive ground plane 78 engaging outer face 74 of base structure 72. Ground plane 78 includes in turn a planar mesh 80 of electrically-conductive broad goods 82 and a filling 84 occupying interstices between adjacent of broad goods 82. Filling 84 is an electrically-conductive embedment of the type prepared according to teachings of the present disclosure provided above. Also included in lightning shield 78 is a layer 86 of a primer material disposed on mesh 80 and filling 84, as well as a layer 88 of a paint material disposed on layer 86. Either or both of the primer of layer 86 and the paint of layer 88 are made from an electrically-conductive embedment of the type prepared according to teachings of the present disclosure provided above.

FIG. 5 is a diagrammatic view in partial disassembly of an assembly 90 that is capable of withstanding a lightning strike by incorporating teachings of the present disclosure, the surface of the assembly dissipates the energy of the lightning strike and shields the assembly from electromagnetic energy associated with the lightning strike. Assembly 90 includes a base structure 72 that is made of a material exhibiting electrical conductivity inadequate to dissipate lightning strike energy and inadequate to shield the assembly from associated electromagnetic energy. Base structure 72 has an outer face 74 that would be at the surface of an assembly in which base structure 72 is incorporated.

An electrically-conductive first lightning shield 92 substantially similar in construction to lightning shield 76 shown in FIG. 4 is secured against outer face 74 of base structure 72. A similarly constructed electrically-conductive second lightning shield 94 is also secured against outer face 74 of base structure 72, close to but in a non-overlapping relationship to first lightning shield 92. As a result, an edge 96 of first lightning shield 92 opposes and an edge 98 of second lightning shield 94, creating a gap therebetween.

That gap shown could have arisen as a result of the assembly of first lightning shield 92 and second lightning shield 94 onto base structure 72. More likely, however, the gap is a result of damage to the outer surface of assembly 90 caused by, for example, a lightning strike at that location. Then, what had previously been an integral lightning shield became separated, at least in the plane of the cross section of FIG. 5, into a pair of lightning shields separated from each other by the gap shown. A suggestion of the violence accompanying such damage is presented in FIG. 5 in the form of a dashed line 100 representing a possible crater extending into base structure 72 below the gap between first lightning shield 92 and second lightning shield 94.

To close or repair the gap between first lightning shield 92 and second lightning shield 94, and to fill the crater in base structure 72 at dashed line 100, the present disclosure provides for a flowable electrically-conductive interface 102, that upon being worked into the gap between edge 96 of first lightning shield 92 and edge 98 of second lightning shield 94 in a manner suggested by arrow W, electrically interconnects the electrically-conductive elements in each of first lightning shield 92 and second lightning shield 94. Interface 102 is a substantially uniformly-distributed embedment of electrically-conductive nanostrands in an electrically-nonconductive matrix. Optionally, interface 102 may also include metal-coated, chopped macroscale fibers by which to afford enhanced material strength thereto.

Details follow of a specific example of implementations of teachings of the present disclosure to repeatedly produce composite panels capable of withstanding Zone 1A lightning strikes with no visible, audible, or NDT-detectable damage. This was a result that has never been attained with any other non-metallic structure, including those protected by the standard lightning strike materials, such as expanded metal foils, woven wire meshes and wound wire systems. The implementation employed a combination of nickel-coated fibers, nickel-coated paper, and nanostrand resin, to produce a glossy white painted aircraft quality composite panel that endured Zone 1A lightning strikes.

The discovery of this same suite of materials (nanostrands and nickel coated fibers) to provide extremely high levels of broadband electromagnetic shielding (in excess of 130 dB), high broadband reflectivity, and zero polarization; all attainable at very low surface loadings, also essentially caused the lightning strike efforts to take a back seat to the more progressive electromagnetic accomplishments.

The materials also are capable of providing sustained protection from the secondary electromagnetic effect of a lightning strike.

The key to accomplishing this task was to create a high level of conductivity in the primer layer of the paint. This was accomplished as follows. As a task in the electromagnetic materials efforts, it was discovered that nickel CVD coated carbon paper was an excellent material. (It was also previously known to the principal investigator that this material would work as an important component of a fully effective lightning strike system).

Nickel CVD coated paper is different than the commercially available nickel coated carbon paper. The commercial paper is simply a nickel coated fiber that is chopped and formed into a paper. It is usually about 17 grams per square meter (gsm) and has a surface resistivity of about 2 ohm per square (the black carbon paper is 8 gsm and 7 ohm per square). The resistivity is limited due to the fact that the paper is bound by an organic binder.

But if the black carbon paper is subjected to a nickel CVD process, the nickel is coated as a continuous film on the outside of the structure. But due to the penetrating nature of the CVD process, the paper is evenly coated throughout its thickness. This can be accomplished only via gas phase CVD, as wet methods would dissolve the paper binder, and vacuum methods would only coat the outer surface, being line of sight.

Figure 6:
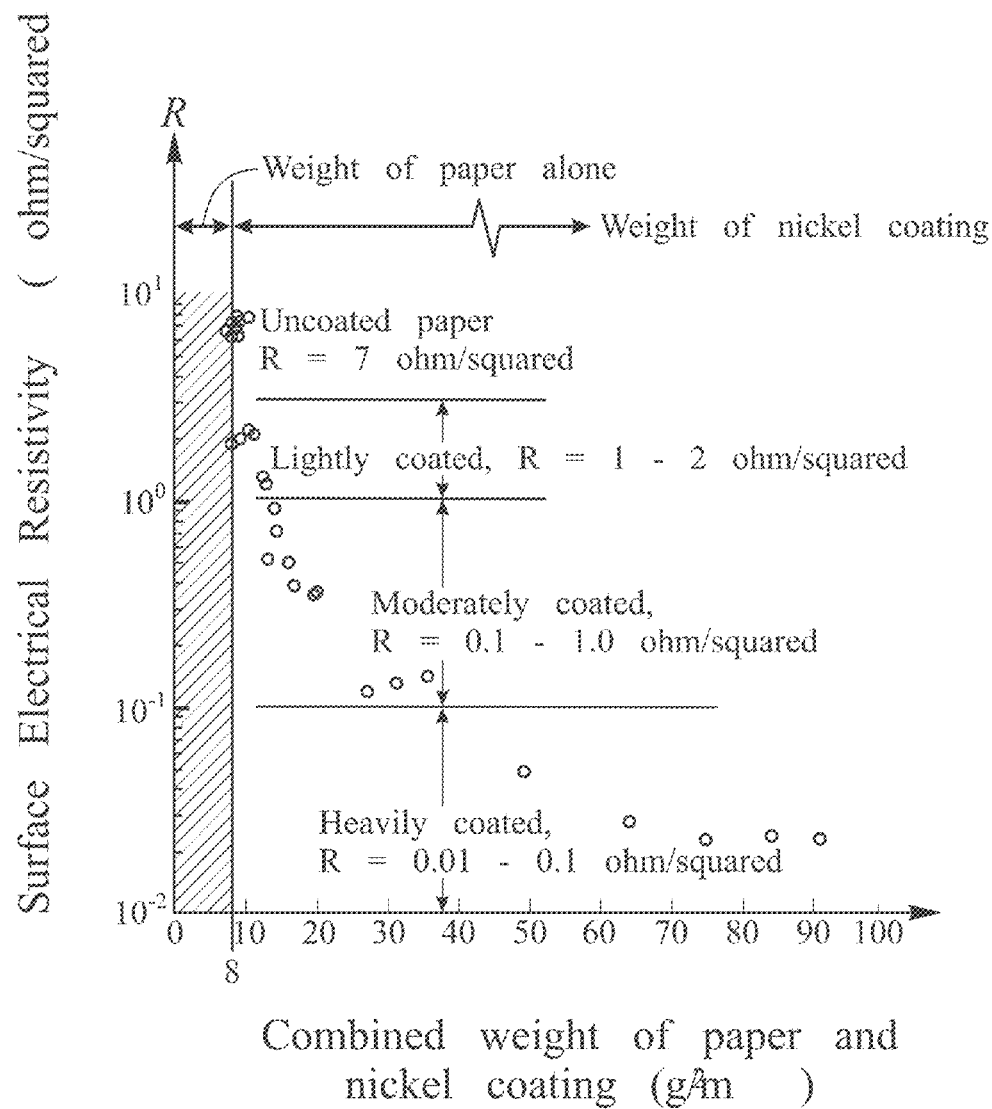
FIG. 6 is a graph depicting the relationship of surface electrical resistivity in a composite material as a function of the amount of nickel contained in electrically conductive paper distributed in the matrix of the composite material.

Metal CVD coated paper can be produced in a continuous reel-to-reel manner. The graph of FIG. 6 shows the relationship of surface resistivity as a function of grams per square meter of nickel added to the paper. There it can be seen that nickel coated paper ranging from 10 gsm and one ohm per square up to 100 gsm and 0.01 ohm per square can be reliably and repeatedly produced.

The nickel coated paper does not act alone in creating such good protection, although there is evidence to suggest that the paper alone may provide full protection for Zone 2 or Zone 3 testing.

In order to provide full protection, the surface or near surface of the paint must be made highly conductive. In addition, a good ground plane is needed at the surface of the composite. These two components then work together to accomplish what neither one alone is capable of.

The best ground plane may be created by using nickel coated carbon cloth as the final structural layer, and by using nanostrands to create a conductive resin surface. By this method, a surface resistivity of approximately 0.01 to 0.02 ohm per square may be attained.

Of course, it is likely that standard ground plane methods using expanded metal foils or interwoven wire mesh or wrapped metal wires may provide an adequate ground plane. But these materials, by their nature, are resin rich. They also exhibit very poor electromagnetic performance above about 2 GHz. The addition of nanostrands to the resin that binds these metals systems has already been proven to dramatically improve both their lightning strike effectiveness and broadband shielding effectiveness.

For lower energy zone strikes in Zones 2 and 3, it is anticipated that a less aggressive ground plane will be required, perhaps obtained by a lower loading of nickel on the fabric, or even the plain carbon cloth may suffice in Zone 3. It is anticipated that in these zones, a ground plane comprising a nickel coated paper with an appropriate level of nickel coating will likely work.

As a final component in the suite of materials, the nanostrands may be used in either the composite resin, or in the primer, or in the paint (though with the color and finish limitations noted above). All of these concepts have been demonstrated. In particular, a layer of the nanostrand paint, loaded with about 100 gsm of nanostrands, has been shown to survive a Zone 1 strike with only a delamination of the upper 2-3 plies, but no fiber breakage.

FIGS. 7-10C are representative photos of the results of Zone 1 tests (200,000 A, 75,000 V, 500 microseconds). All panels are 16"×16", and are constructed of a 7 ply 370 gsm 5HS fabric, with a 350 cure epoxy resin. FIG. 11 is a representative photo of the results of a Zone 2 test.

Figure 7:
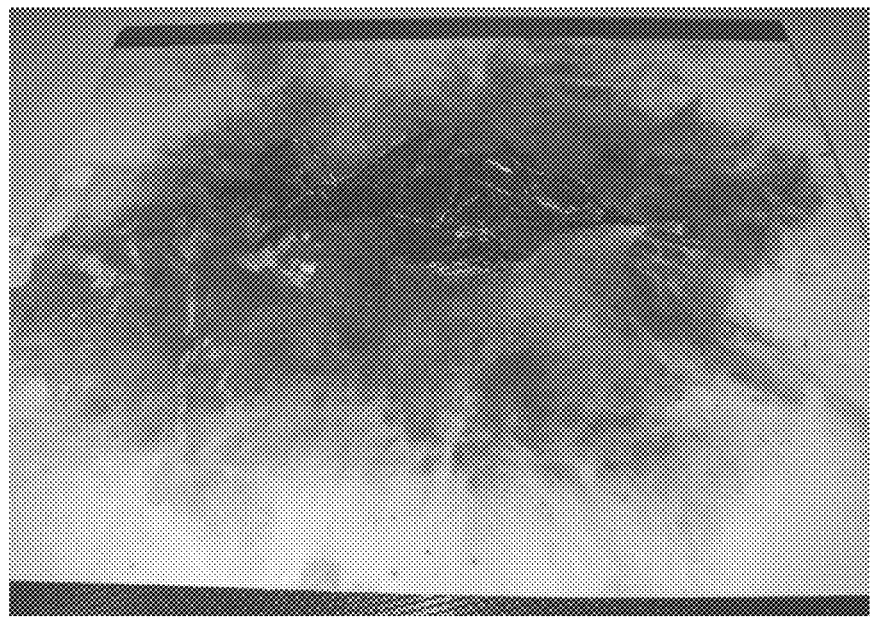
FIG. 7 is a photograph of a first test control panel not incorporating teachings of the present disclosure after being subjected to a simulated Zone 1 lightning strike.

As a reference, FIG. 7 is a photograph of a control panel with no lightning protection, which is seen to have been damaged to an expected degree.

Figure 8:
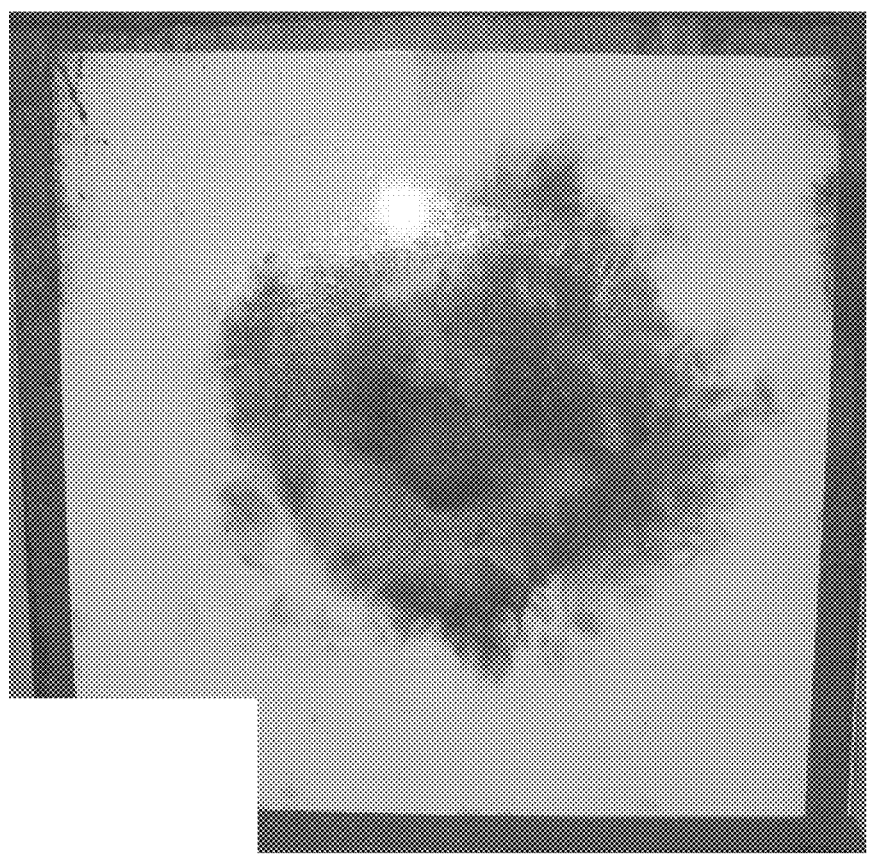
FIG. 8 is a photograph of a second test control panel not incorporating teachings of the present disclosure after being subjected to a simulated Zone 1 lightning strike.

FIG. 8 is a photograph of an industry standard copper mesh panel with standard paint, which is also damaged to an expected degree. In the industry standard panel, copper mesh is blown away, moderate delamination has occurred of at least one carbon ply. For repair, this strike would require removal and replacement of the top layers of the composite, followed by replacement of the copper mesh, followed by a bake cycle to cure the replacement materials, followed by painting.

FIGS. 9 and 10A-10C are photographs of identical composite panels with no damage to the panel after the Zone 1A strike. Both of these panels have a nickel coated carbon/nanoresin structural ground plane. The first panel (FIG. 9) is using the nanopaint, and the second panel (FIG. 10A) is using the NiCVD paper in the paint. In both panels, the underlying electromagnetic ground plane remains intact, providing uninterrupted protection from secondary effects of the strike and from other electromagnetic intrusions. For repair of either of these panels, the only action requires would be to repaint them with the applicable system.

Figure 9:
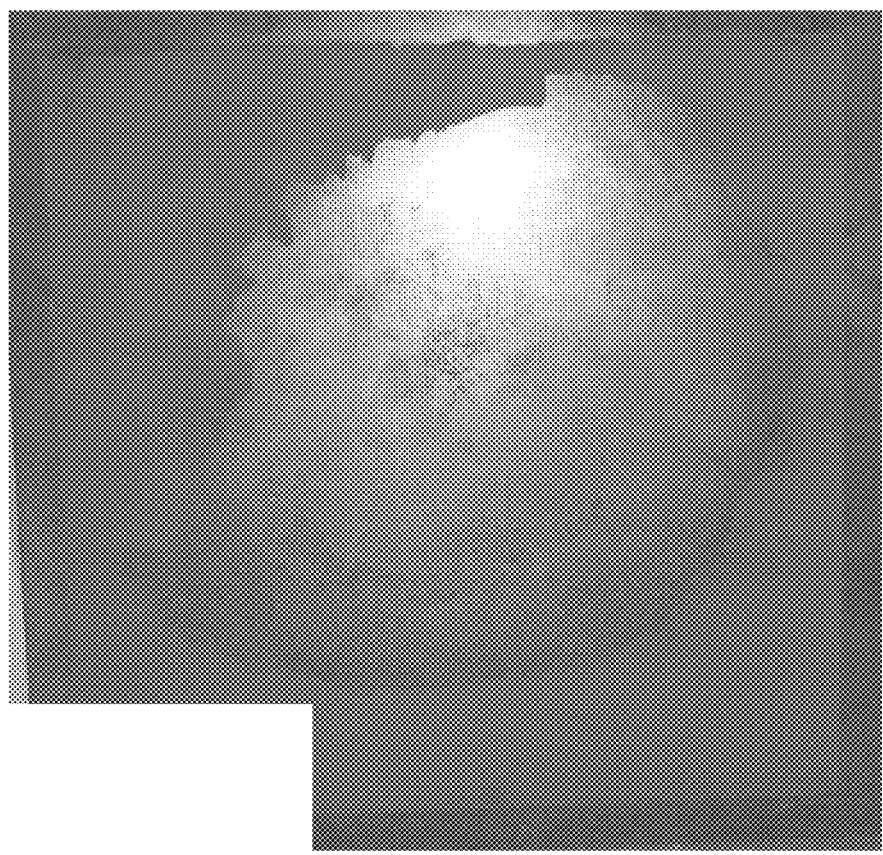
FIG. 9 is a photograph of a first test panel incorporating teachings of the present disclosure after being subjected to a simulated Zone 1 lightning strike.

In the panel of FIG. 9, which employs nickel coated fabric, nanostrand resin and nanostrand paint, the paint blown away, but the underlying composite is undamaged.

Figure 10A:
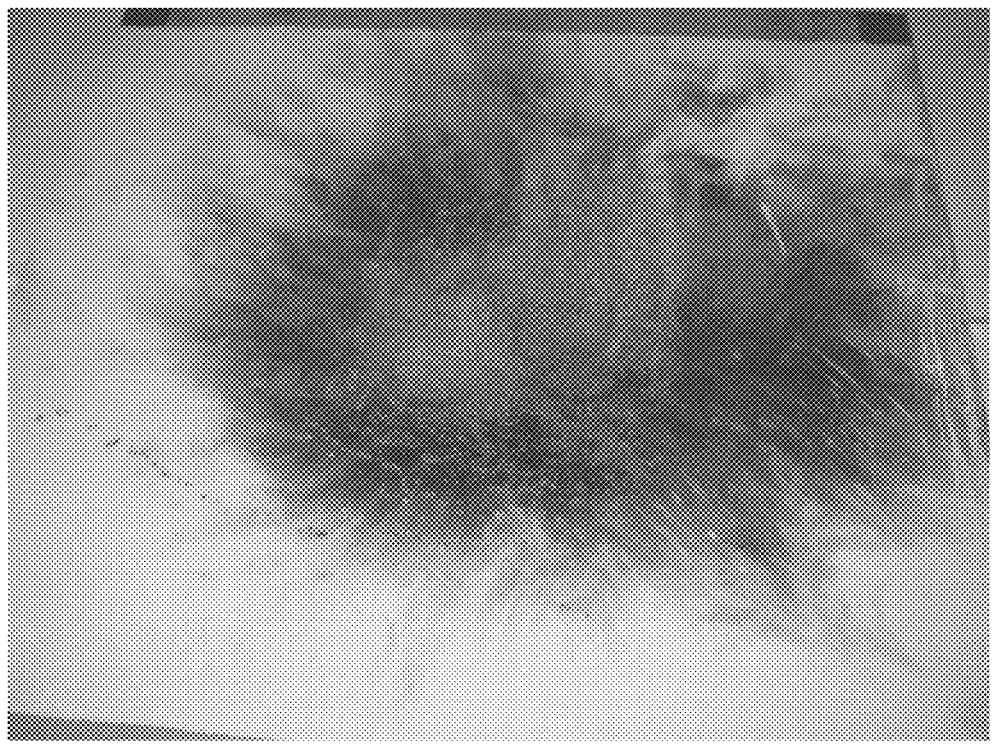
FIG. 10A is a photograph of a second test panel incorporating teachings of the present disclosure after being subjected to a simulated Zone 1 lightning strike.
Figure 10B:
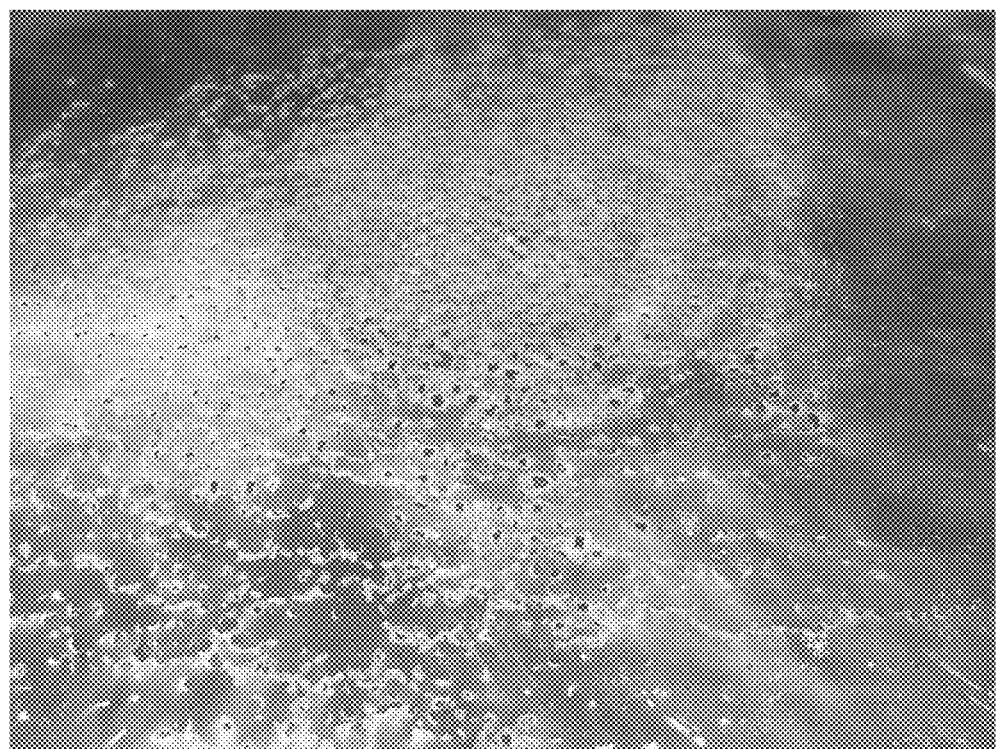
FIG. 10B is a close-up photograph of the test panel of FIG. 10A.
Figure 10C:
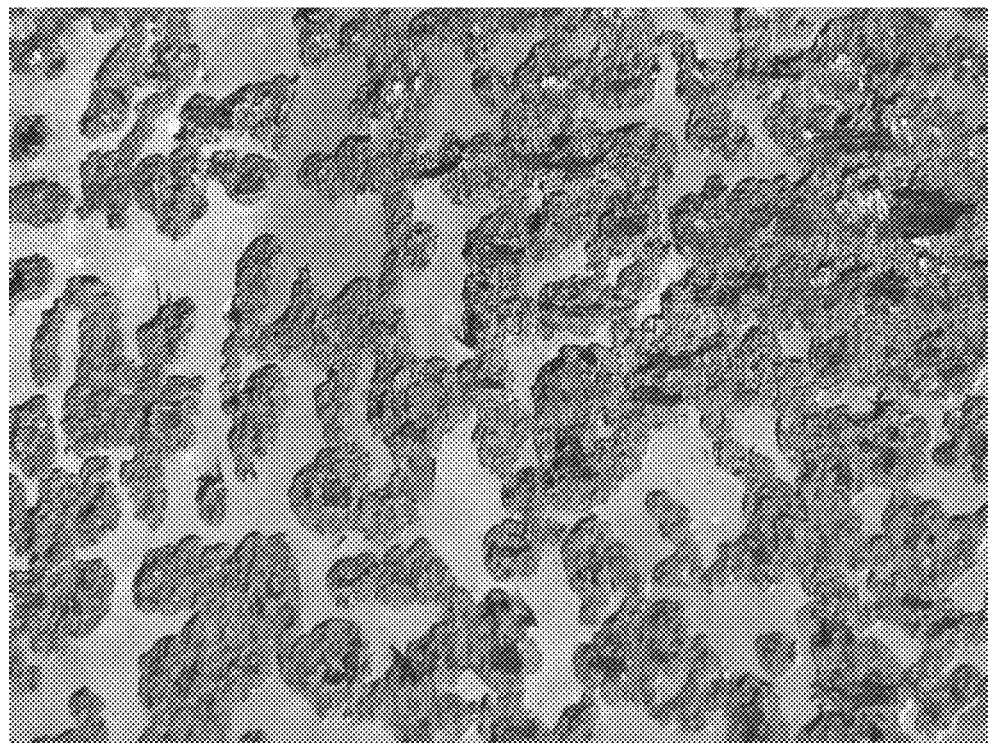
FIG. 10C is a microscopic perspective of the test panel of FIGS. 10A and 10B.
Figure 11:
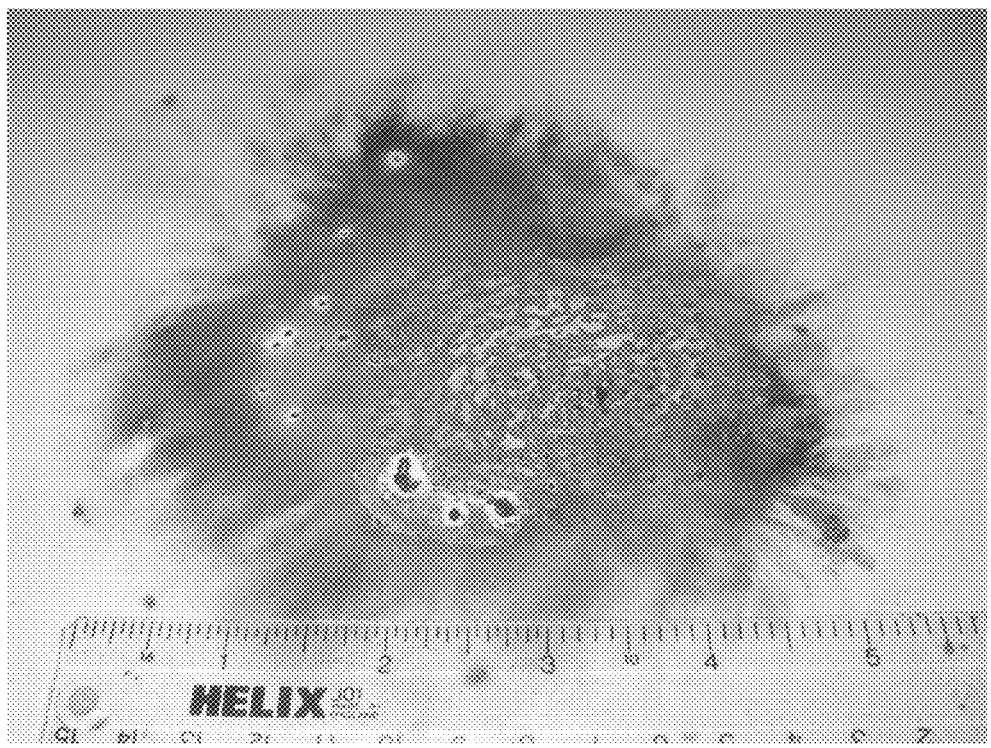
FIG. 11 is a photograph of a third test panel incorporating teachings of the present disclosure after being subjected to a simulated Zone 2 lightning strike.

In the panel of FIGS. 10A-10C, which employs nickel coated fabric, nanostrand resin and nickel CVD-coated paper in the primer section of the paint, much of the paint is still intact. There is a small area of about 0.25 by 0.375 inches that exhibits exposed fibers from the panel, but the fibers are nonetheless intact. FIG. 10B is a close up of FIG. 10A, while FIG. 10C is a microscopic view of an area of damage in FIG. 10A. FIG. 11 depicts an area of Zone 2 strike damage from FIG. 10A.

The weight penalty of both of these systems is in the 100 to 400 gsm range, inclusive of all additional resins and coatings. This is comparable to or less than a metal mesh system when one considers the resin and surfacing layers required for those systems.

All of the techniques employed to create these panels used standard industrially accepted methods of technology insertion, such as resin filming, autoclaving, spraying, etc; and used commercially off the shelf fibers, resins, paints and paint bases; except for the coated fibers and the papers and the nanostrands, all of which were produced by processes which have been demonstrated to be commercially viable and scalable.

It is clear by comparing the photographs of FIGS. 7 and 8 with the photographs of FIGS. 9, 10A-10C, and 11 that the technology of the present disclosure affords an unprecedented level of lightning strike protection. Correspondingly, these materials shown in the photographs of FIGS. 9, 10A-10C, and 11 perform the additional role of providing exceptional levels of broadband electromagnetic protection.

The present disclosure contemplates methods for providing lightning protection for composite articles possessed of insufficient electrical conductivity of withstand a lightning strike. A number of such methods may be used to produce the composite materials embodying teachings of the present disclosure. Known methods for composite manufacture may be applied to nanostrand-based composites, as indicated previously. Other methods may alternatively be used to obtain conductivity enhancements or to facilitate manufacturing.

The present disclosure may be embodied in other specific forms without departing from its structures, methods, or other essential characteristics as broadly described herein and claimed hereinafter. The described embodiments are to be considered in all respects only as illustrative, and not restrictive. The scope of the disclosure is, therefore, indicated, by the appended claims, rather than by the foregoing description. Ail changes that come within the meaning and range of equivalency of the claims are to be embraced within their scope.

What is claimed is:

1. A composite article for incorporation at the surface of an assembly, the composite article being capable of withstanding a lightning strike by dissipating the energy of the lightning strike and by shielding the assembly from electromagnetic energy associated with the lightning strike, the composite article comprising:
  a base structure comprised of a material exhibiting electrical conductivity inadequate to dissipate lightning strike energy and inadequate to shield the assembly from associated electromagnetic energy, the base structure having an outer face; and
  an electrically-conductive lightning shield secured against the outer face of the base structure, the shield comprising a substantially uniformly-distributed embedment of electrically-conductive nanostrands in a matrix otherwise exhibiting electrical conductivity inadequate to dissipate lightning strike energy and inadequate to shield the assembly from associated electromagnetic energy, wherein the lightning shield comprises:
    an electrically-conductive ground plane secured to the outer face of the base structure; and
    an electrically-conductive skin comprised of the embedment and disposed on the ground plane.

2. A composite article as recited in claim 1, wherein the lightning shield comprises an electrically-conductive ground plane engaging the outer face of the base structure, the ground plane comprising:
  a planar mesh of electrically-conductive broad goods; and
  a filling comprising at least a portion of the embedment occupying interstices of the planar mesh.

3. A composite article as recited in claim 2, wherein the electrically-conductive broad goods comprise at least one of wires, a screen, a mesh, a weaving, an expanded foil, a fabric, a paper, a paper of nonwoven metal-coated fibers, electroplated electrically-nonconductive fibers, and electrically-nonconductive fibers coated with an electrically-conductive material.

4. A composite article as recited in claim 1, wherein the nanostrands comprise a metal.

5. A composite article as recited in claim 4, wherein the metal is chosen from among the group of metals including nickel, nickel aluminides, iron, iron aluminides, alloys of nickel and iron, and alloys of nickel and copper.

6. A composite article as recited in claim 1, wherein the lightning shield comprises a three-dimensional veil of the electrically-conductive nanostrands engaging the outer face of the base structure.

7. A composite article as recited in claim 6, wherein the veil is embedded in the matrix.

8. A composite article as recited in claim 1, wherein the matrix comprises a primer material engaging the outer face of the base structure.

9. A composite article as recited in claim 8, wherein the paint material engages the primer material.

10. A composite article as recited in claim 1, wherein the matrix comprises a paint material attached to the outer face of the base structure.

11. A composite article for incorporation at the surface of an assembly, the composite article being capable of withstanding a lightning strike by dissipating the energy of the lightning strike and by shielding the assembly from electromagnetic energy associated with the lightning strike, the composite article comprising:
  a base structure comprised of a material exhibiting electrical conductivity inadequate to dissipate lightning strike energy and inadequate to shield the assembly from associated electromagnetic energy, the base structure having an outer face; and
  an electrically-conductive lightning shield comprising:
    an electrically-conductive ground plane secured against the outer face of the base structure, the ground plane comprising a metal chemical-vapor-deposition coated non-woven material embedded in a matrix otherwise exhibiting electrical conductivity inadequate to dissipate lightning strike energy and inadequate to shield the assembly from associated electromagnetic energy; and
    an electrically-conductive skin disposed on the ground plane comprising an embedment of electrically-conductive nanostrands.

12. A composite article for incorporation at the surface of an assembly, the assembly thereby being enabled to withstand a lightning strike by dissipating the energy of the lightning strike and by shielding the assembly from electromagnetic energy associated with the lightning strike, the composite article comprising:
  a base structure comprised of a material exhibiting electrical conductivity inadequate to dissipate lightning strike energy and inadequate to shield the assembly from associated electromagnetic energy, the base structure having an outer face; and
  an electrically-conductive lightning shield comprising:
    an electrically-conductive ground plane secured against the outer face of the base structure;
    an electrically-conductive skin disposed on the ground plane comprising an embedment of electrically-conductive nanostrands; and
    a substantially uniform distribution of electrically-conductive nanostrands co-cured into the base structure.

13. An assembly capable of withstanding a lightning strike, the surface of the assembly dissipating the energy of the lightning strike and providing a shield from electromagnetic energy associated with the lightning strike, the assembly comprising:
  a base structure comprised of a material exhibiting electrical conductivity inadequate to dissipate lightning strike energy and inadequate to shield from associated electromagnetic energy, the base structure having an outer face;
  a first electrically-conductive lightning shield secured against the outer face of the base structure;
  a second electrically-conductive lightning shield secured against the outer face of the base structure in a non-overlapping relationship to the first lightning shield with an edge of the second lightning shield opposing an edge of the first lightning shield; and
  an electrically-conductive interface interconnecting the edge of the first lightning shield and the opposing edge of the second lightning shield, the interface comprising a substantially uniformly-distributed embedment of electrically-conductive nanostrands in an electrically-nonconductive matrix.

14. A composite article as recited in claim 13, wherein the electrically-conductive interface further comprises metal-coated, chopped macroscale fibers.

15. A composite article as recited in claim 13, wherein the electrically-conductive interface further comprises an impregnated thin sheet of nanostrands with at least one of a sealant and an adhesive to provide an electrically-conductive gasket.

* * * * *